United States Patent
Sakai et al.

(10) Patent No.: US 6,297,594 B1
(45) Date of Patent: Oct. 2, 2001

(54) PLASMA SOURCE ION IMPLANTING APPARATUS USING THE SAME

(75) Inventors: Shigeki Sakai; Masato Takahashi, both of Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 09/495,455

(22) Filed: Feb. 1, 2000

(30) Foreign Application Priority Data

Feb. 2, 1999 (JP) ................................................ 11-025024

(51) Int. Cl.$^7$ .................................................... H01J 7/24
(52) U.S. Cl. ................ 315/111.41; 315/111.21; 315/111.51; 315/111.81; 313/362.1; 204/298
(58) Field of Search ...................... 315/111.41, 111.21, 315/111.81, 111.51; 313/362.1; 204/298

(56) References Cited

U.S. PATENT DOCUMENTS

| | | | |
|---|---|---|---|
| 4,727,293 | * | 2/1988 | Asmussen et al. ............. 315/111.41 |
| 4,788,473 | * | 11/1988 | Mori et al. ...................... 315/111.41 |
| 4,874,497 | | 10/1989 | Matsuoka et al. .................... 204/298 |
| 4,911,814 | * | 3/1990 | Matsuoka et al. .................... 204/298 |
| 5,107,170 | * | 4/1992 | Ishikawa et al. ................. 313/362.1 |
| 5,280,219 | * | 1/1994 | Ghanbari ........................ 315/111.41 |
| 5,399,871 | | 3/1995 | Ito et al. ........................ 250/492.21 |
| 5,430,355 | * | 7/1995 | Paranjpe ......................... 315/111.21 |
| 5,545,257 | | 8/1996 | Vella ................................. 118/723 R |

FOREIGN PATENT DOCUMENTS

| | | | |
|---|---|---|---|
| A-5-47338 | 2/1993 | (JP) | ............................. H01J/37/30 |
| A-5-234562 | 9/1993 | (JP) | ........................... H01J/37/317 |

* cited by examiner

*Primary Examiner*—Don Wong
*Assistant Examiner*—Jimmy T. Vu
(74) *Attorney, Agent, or Firm*—Finnegan, Henderson, Farabow, Garrett & Dunner, L.L.P.

(57) ABSTRACT

A plasma source includes a magnetic field generating unit for generating within a plasma chamber a magnetic field B for electron cyclotron resonance, which has a direction crossing a direction in which the plasma is discharged through a plasma emission aperture. The plasma source is applied to an ion implanting apparatus.

7 Claims, 4 Drawing Sheets

PLASMA SOURCE ION IMPLANTING APPARATUS USING THE SAME

BACKGROUND OF THE INVENTION

1. Field of the Invention

The present invention relates to a plasma source which supplies a plasma to an ion beam and neutralizes the ion beam by electrons of the plasma to prevent the target from being charged, in an ion beam irradiation apparatus (e.g., an ion implanting apparatus) for radiating an ion beam toward a target, more particularly, relates to a means for preventing high energy electrons from being contained in the discharged plasma, and the ion implanting apparatus using the plasma source.

2. Description of the Related Art

In carrying out a process, e.g., ion implanting process, to implant into a targets for example, a semiconductor wafer, by radiating an ion beam to the target, a problem arises in which the target is positively charged (charged up) by the positive charge of the ion beam.

In order to solve the charge-up problem, JP-A-5-234562 and JP-A-5-47338 disclose that a plasma source is located near a target. Plasma is supplied to an ion beam. The ion beam is neutralized by electrons in the plasma, to thereby prevent the charging of the target. Incidentally, the plasma source used for such purpose is also called an ion beam neutralizer.

The plasma source will be described with reference to a drawing. FIG. 6 shows an apparatus in which a conventional plasma source is attached to an ion beam irradiation apparatus.

In the apparatus, an ion beam 34 is irradiated on a target 36 that is held by a holder 38 within a vacuum container 32, whereby a process of ion implanting, ion beam etching or the like is applied to the target 36. The target 36 is a semiconductor wafer, another substrate, or the like.

As shown in FIG. 6, a hole 33 is formed in a side wall of the vacuum container 32, which is located near the target 36. A plasma source 2 is attached to a portion on the vacuum container 32, which is located near the hole 33, while an insulating member 30 is interposed therebetween.

The plasma source 2 of the ECT (electron cyclotron resonance) type is composed of a plasma chamber 4 of metal for generating a plasma 20, a gas introducing pipe (gas introducing means) 10 for introducing a gas 12 for plasma generation, such as argon or xenon, into the plasma chamber 4, an antenna (microwave introducing means) 14 of metal for introducing a microwave 15 at 2.45 GHz into the plasma chamber 4, and a magnetic coil 18 for generating along a plasma emission direction 22 a magnetic field B having an intensity high enough to cause an electron cyclotron resonance within the plasma chamber 4 (the intensity: approximately 87.5 mT when the frequency of the microwave 15 is 2.45 GHz) Reference numeral 16 is a connector.

To make it easy to extract the plasma 20 into the vacuum container 32, provision is preferably made of means for applying a DC voltage (extraction voltage) from a DC extraction power supply 28 to between the plasma chamber 4 and the vacuum container 32 in a state that a positive polarity of the extraction voltage is set at the vacuum container 32.

The front side of the plasma chamber 4 consists of a front board 6 with a plasma emission aperture 8 in this instance. A plasma 20 that is efficiently generated by microwave discharging and electron cyclotron resonating operations within the plasma chamber 4 flows out through the plasma emission aperture 8 into the vacuum container 32, and is supplied to the ion beam 34 (this is called a plasma bridge.). Through the plasma bridging operation, the ion beam 34 is neutralized by the electrons in the plasma 20, to thereby suppress formation of positive charges at the target 36, which results from the ion beam irradiation.

The plasma source 2 uses the microwave 15, not the filament, for the generation of the exposure unit 20. Therefore, there is no fear that the target 36 is contaminated with the materials of the filament that are sputtered out through the plasma emission aperture 8.

Further, the inner wall of the plasma chamber 4 and the antenna 14 are covered with insulating covers 24 and 26, respectively. With use of the covering, there is no fear that the metal plasma chamber 4, the front board 6 and the antenna 14 are sputtered by the plasma 20 to thereby contaminate the target 36.

In the thus constructed plasma source 2, when energy of electrons contained in the plasma 20 is high, the high energy electrons reach the target 36 and possibly charges negatively (charges up) the target up to a voltage corresponding to the electron energy. Some technical measure should be taken for the negative charging of the target 36.

Recently, the transistors (FETS) formed in the surface of the target wafer are remarkably reduced in size (e.g., one side of each of them is about 0.18 μm), and its gate oxide film is extremely thinned (e.g., about 5 nm). For this reason, it is necessary to set the charge-up voltage at an extremely low voltage (e.g., about 5V or lower). Otherwise, the charge-up voltage causes the breakdown of the transistors, possibly resulting in reduction of a production yield in fabricating the transistors and deterioration of product reliability.

In the plasma source 2 mentioned above, within the plasma chamber 4, the magnetic field B for the electron cyclotron resonance is generated along the plasma emission direction 22 in which the plasma flows out through the plasma emission aperture 8. Accordingly, the electrons in the plasma 20 within the plasma chamber 4 are accelerated by the electron cyclotron resonance along the magnetic field B. The high speed (i.e., high energy) electrons are extracted through the plasma emission aperture 8 since the plasma emission aperture 8 is located along the acceleration direction of the electrons. Those electrons are supplied to the ion beam 34, and reaches the target 36. As a result, a problem of increase of the charge-up voltage of the target 36 arises.

The energy of the electrons in the exposure unit 20 supplied from the plasma source 2 is distributed over a range from several eV to 100 eV, as will be described in detail later referring to FIG. 4. Therefore, the charge-up voltage of the target 36 could be increased up to a value near 100V at maximum.

SUMMARY OF THE INVENTION

Accordingly, the present invention has an object to prevent high energy electrons from being contained in the emission plasma.

The plasma source of the present invention has magnetic field generating means for generating within a plasma chamber a magnetic field causing the electron cyclotron resonance in a direction crossing a direction in which a plasma is flows out through the plasma emission aperture.

The electrons that are accelerated by the electron cyclotron resonance within the plasma chamber move along the magnetic field having the direction crossing the plasma emission direction. Therefore, those electrons hit the inner wall of the plasma chamber to disappear. Accordingly, only electrons of low speed in the plasma, which are diffused in a region in the vicinity of the plasma emission aperture, are extracted through the plasma emission aperture. In this way, high energy electrons are prevented from being contained in the emission plasma.

PREFERRED EMBODIMENTS OF THE INVENTION

The present invention will be described as follows referring to the accompanying drawings as follows.

Figure 1:
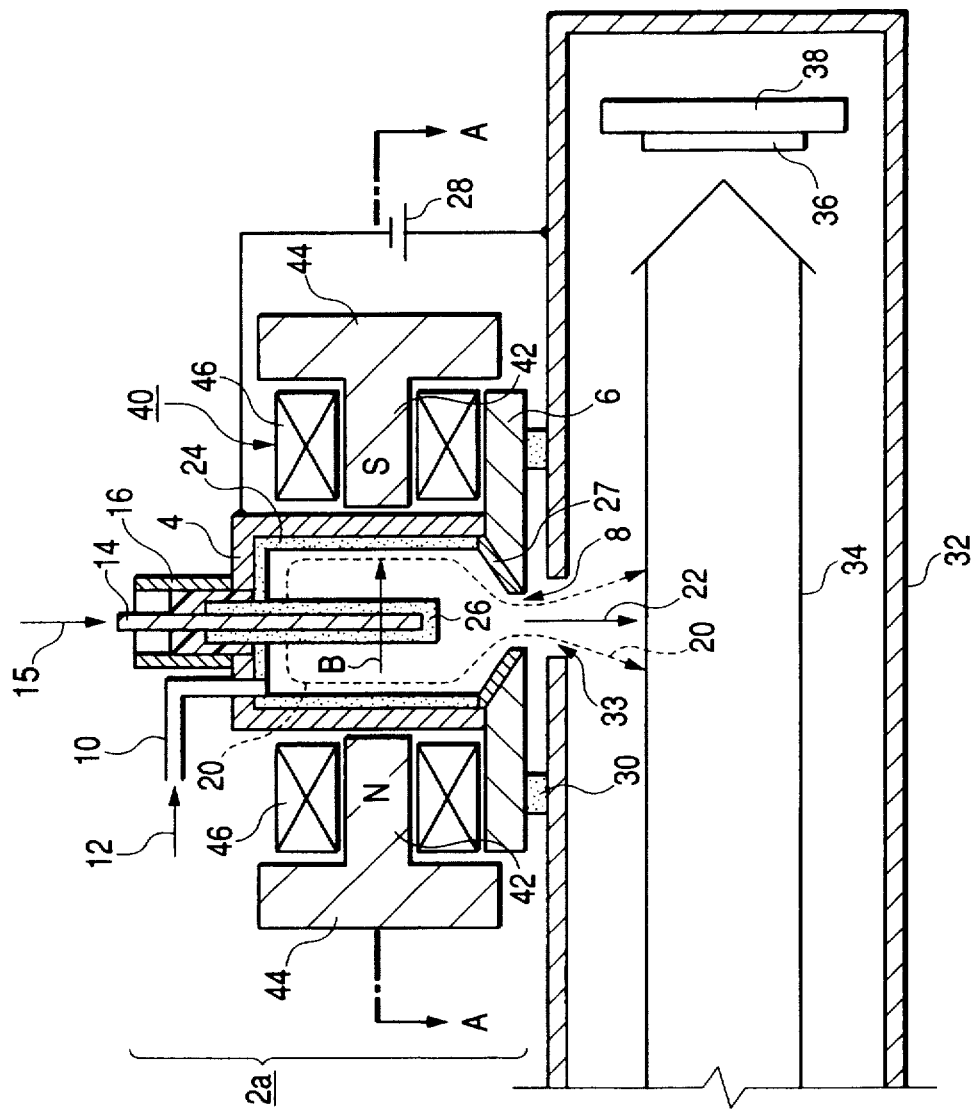
FIG. 1 is a longitudinal sectional view showing an apparatus in which a plasma source constructed according to the present invention is assembled into an ion beam irradiation apparatus (ion implanting apparatus)
Figure 2:
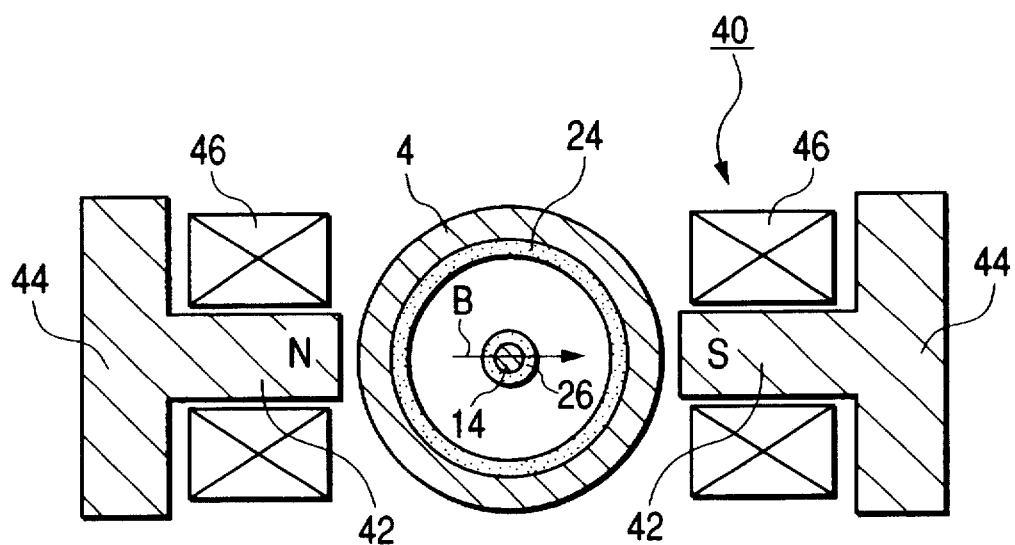
FIG. 2 is a traverse cross sectional view taken on line A—A in FIG. 1.
Figure 6:
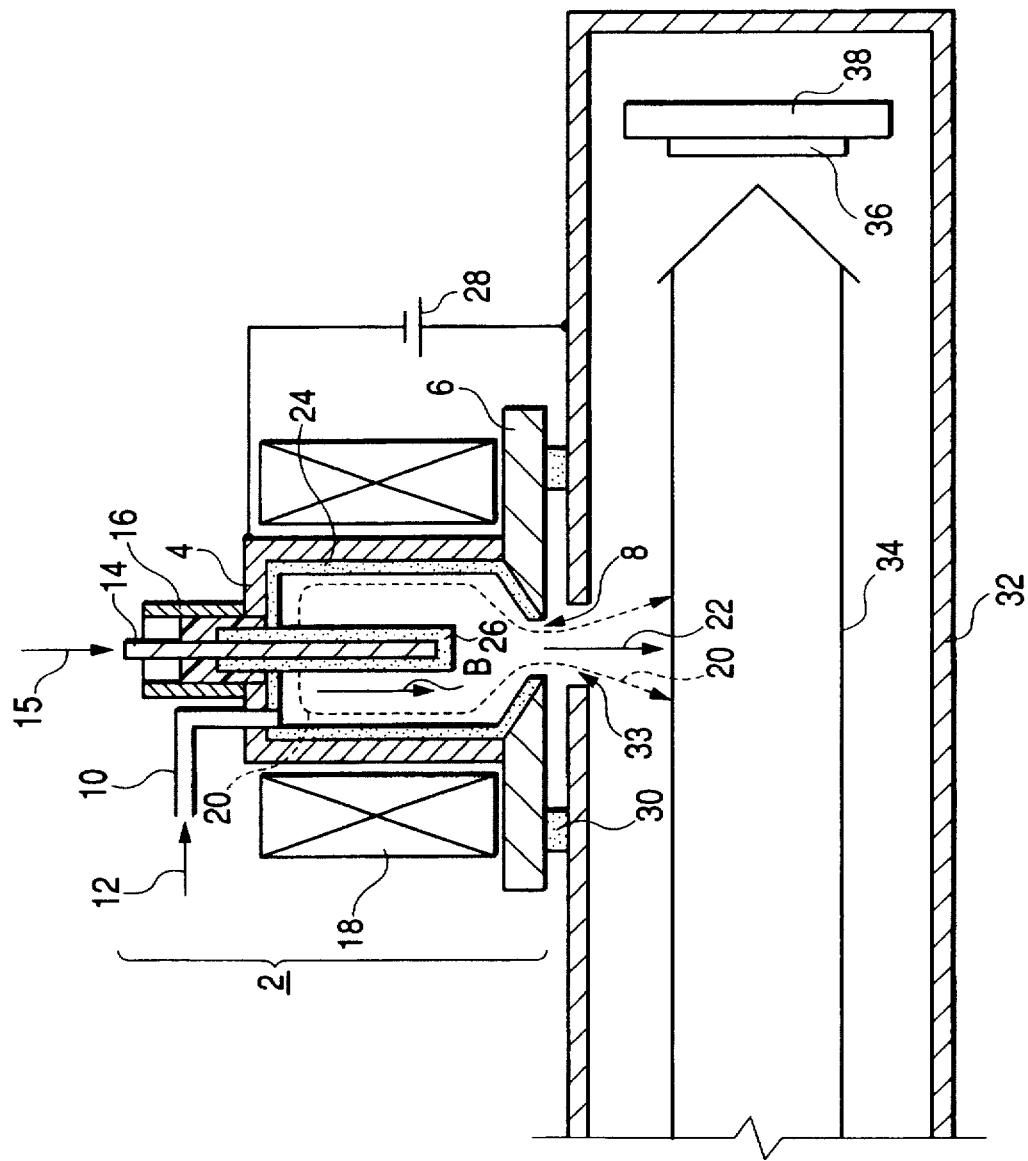
FIG. 6 is a longitudinal sectional view showing an apparatus in which a conventional plasma source is assembled into an ion beam irradiation apparatus.

FIG. 1 is a longitudinal sectional view showing an apparatus in which a plasma source constructed according to the present invention is assembled into an ion beam irradiation apparatus (ion implanting apparatus). FIG. 2 is a cross sectional view taken on line A—A in FIG. 1. In the figures, like or equivalent portions are designated by the same reference numerals in FIG. 6. Description to follow will be given placing emphasis on the differences of the apparatus from FIG. 6.

A plasma source 2a of the embodiment is of the ECR type, like the conventional one. In the embodiment, the magnetic field generating means takes the form of an electromagnet 40 for generating a magnetic field B, which causes the ECR, in a direction crossing (e.g., orthogonal or substantially orthogonal to) a direction 22 in which a plasma flows out through the plasma emission aperture 8.

An intensity of the magnetic field B within the plasma chamber 4 is approximately 87.5 mT (875 Gauss) when the frequency of the microwave 15 is 2.45 GHz. The direction of the magnetic field B may be opposite to that illustrated (the same thing is true for a case of FIG. 3.).

In this embodiment, the electromagnet 40 is formed with a pair of magnetic poles 42 which are laterally disposed oppositely with respect to the plasma chamber 4, coils 46 wound on the magnetic poles 42, and a yoke 44 interconnecting the magnetic poles 42. Both the coils 46 are driven (excited) by a DC power supply (not shown).

In the plasma source 2a, electrons in the plasma 20 that are generated within the plasma chamber 4 are accelerated through the electron cyclotron resonance. The accelerated electrons move along the magnetic field B having the direction crossing the plasma emission direction 22. Therefore, those electrons hit the inner wall (or the cover 24 covering the inner wall) of the plasma chamber 4 to disappear. Accordingly, only the low speed electrons in the plasma 20, which are diffused into a region in the vicinity of the plasma emission aperture 8, are extracted through the plasma emission aperture 8. In this way, high energy electrons are prevented from being contained in the plasma 20 generated by the plasma source 2a.

Accordingly, if the plasma source 2a is used for neutralizing the ion beam 34 (used as an ion beam neutralizer) as in the above case, a negative charge-up voltage at the target 36 may be reduced to be low. This results in reduction of a production yield in fabricating the transistors and deterioration of product reliability.

Figure 3:
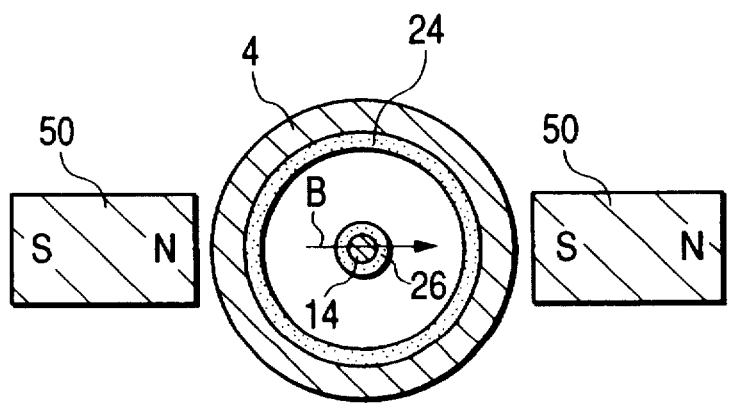
FIG. 3 is a traverse cross sectional view showing a case where a permanent magnet is used for the magnetic field generating means, the case corresponding to the FIG. 2 case.

The magnetic field generating unit for generating the magnetic field B may be constructed with a permanent magnet. A structure using the permanent magnetic is shown in FIG. 3. In this case, as shown, a pair of permanent magnets 50 are laterally disposed oppositely with respect to the plasma chamber 4, whereby a magnetic field B as mentioned above is generated.

The front board 6 is made preferably of magnetic material, such as magnetic stainless steel. The front board 6 made of such a material suppresses the spreading of a magnetic field leaking from the electromagnet 40 or the permanent magnet 50 through and out of the plasma emission aperture 8. Accordingly, there is no chance that a stream of electrons in the plasma 20 that flows out through the plasma emission aperture 8 is curved in its traveling path by the leaking magnetic field, or those electrons are captured by the leaking magnetic field. In this respect, the extraction efficiency of electrons is improved. This effect is marked when the electron energy from the plasma emission aperture 8 is low.

The covers 24 and 26 for covering the inner wall of the plasma chamber 4 and the antenna 14 are preferably made of ceramics discharging a less amount of impurities, such as alumina or boron nitride or silicon, or carbon or the like which is free from the heavy metal contamination problem.

Where the inner wall of the plasma chamber 4 and the inner wall of the front board 6 are entirely covered with insulating material, electrons flow is interrupted and the electron emission is difficult. To avoid this, at least a part of the cover of the inner wall of the plasma chamber 4 is made preferably of conductive material. In the instance of FIG. 1, the cover 27 covering a portion in the vicinity of the plasma emission aperture 8 is made of conductive material, such as silicon or carbon.

The microwave introducing unit for introducing the microwave 15 into the plasma chamber 4 may be a wave guide or a guide window for the microwave 15 or the like, in place of the antenna 14.

EXAMPLE

An experiment was conducted under the following conditions. The results of measuring an electron energy distribution in plasma 20 discharged from the conventional plasma source 2 shown in FIG. 6 were plotted in a graph of FIG. 4. The results of measuring an electron energy distribution in a plasma 20 generated by the plasma source 2a of the invention shown in FIG. 1 were plotted in a graph of FIG. 5. An electrostatic energy distribution analyzer was used for the measurements.

Introducing gas: xenon of 0.2 ccm

Implanting microwave power: 100 W

Extraction voltage: 30V

Figure 4:
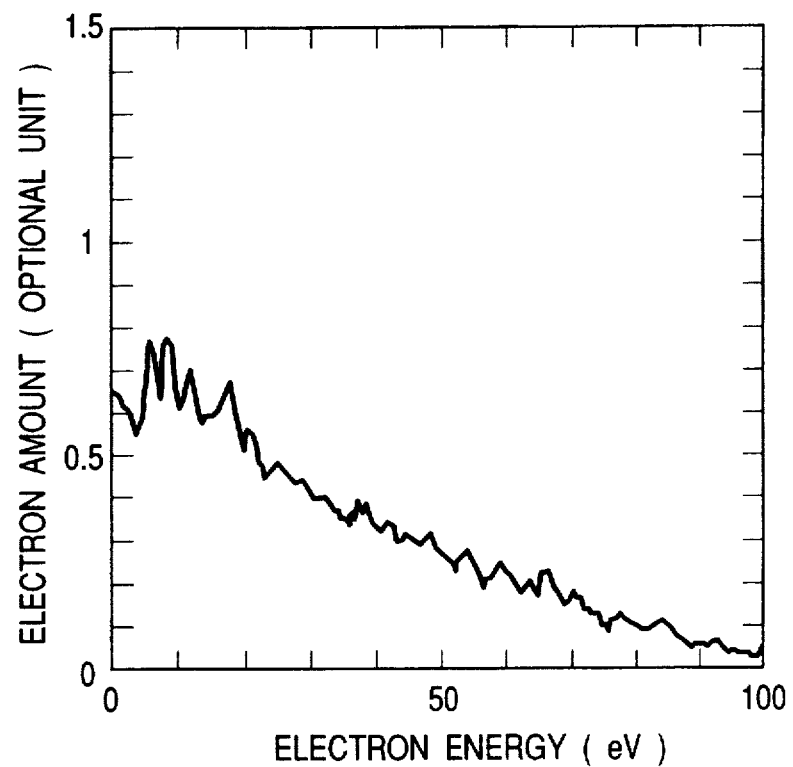
FIG. 4 is a graph showing the results of measuring an electron energy distribution in a plasma discharged from a conventional plasma source shown in FIG. 6.

As seen from FIG. 4, the electron energy in the plasma 20 generated by the conventional plasma source 2 distributed over a broad range from several eV to 100 eV, and a large amount of high energy electrons exist.

Figure 5:
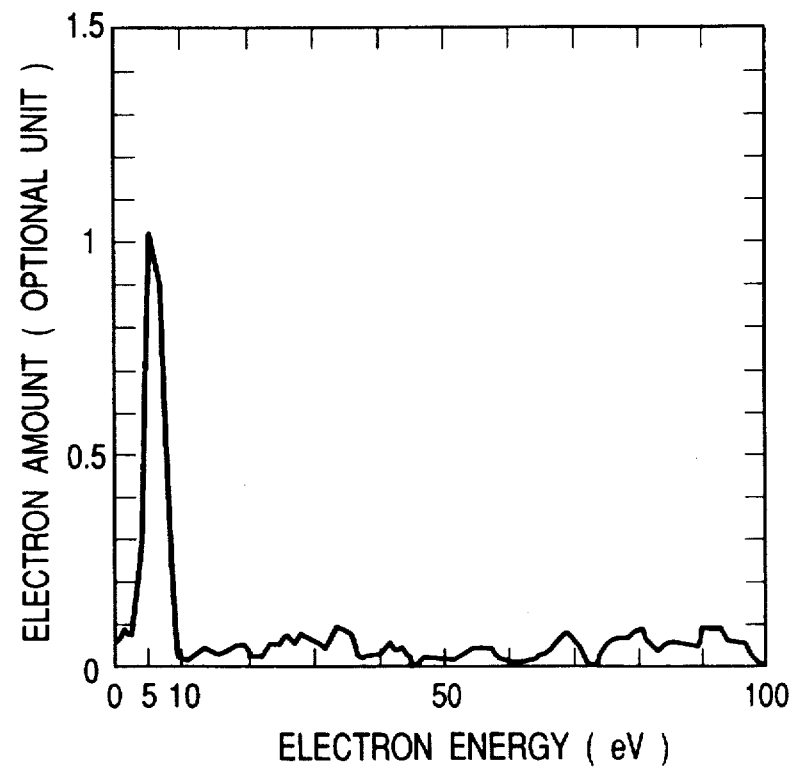
FIG. 5 is a graph showing the results of measuring an electron energy distribution in a plasma generated by a plasma source shown in FIG. 1.

On the other hand, as shown in FIG. 5, most of electron energy in the plasma 20 generated by the plasma source 2a of the invention is localized at a region of 5 eV and therearound. This tact clearly shows that the invention succeeds in excluding high energy electrons from the plasma 20.

As seen from the foregoing description, the plasma source of the invention includes magnetic field generating means for generating a magnetic field having a direction crossing a direction in which a plasma flows out through a plasma emission aperture. Accordingly, only lowspeed electrons in the plasma, which are diffused in a region in the vicinity of the plasma emission aperture, are extracted through the plasma emission aperture. In this way, high energy electrons are successfully excluded from the emission plasma.

What is claimed is:

1. A plasma source comprising:

a plasma chamber into which microwave power is introduced so that a plasma is generated by the utilization of electron cyclotron resonance in the plasma chamber, the plasma flowing out through a plasma emission aperture formed in the front side of said plasma chamber; and a magnetic field generating means for generating within a plasma chamber, a magnetic field causing the electron cyclotron resonance in a direction crossing a direction in which the plasma flows out through said plasma emission aperture.

2. The plasma source according to claim 1, wherein the magnetic field is generated to be substantially orthogonal to the direction crossing the direction in which the plasma is flows out through said plasma emission aperture.

3. The plasma source according to claim 1, wherein said magnetic field generating means is an electromagnet.

4. The plasma source according to claim 1, wherein said magnetic field generating means is a permanent magnet.

5. The plasma source according to claim 1, wherein at least a part of a cover of an inner wall of said plasma chamber is made of a conductive material.

6. The plasma source according to any one of claims 1 to 5, further comprising an antenna for introducing microwave, which is covered with an insulation material.

7. An ion implanting apparatus comprising the plasma source according to any one of claims 1 to 5 for neutralizing the ion beam.

* * * * *